(12) United States Patent  
Matsumoto (10) Patent No.: US 7,724,011 B2
(45) Date of Patent: May 25, 2010

(54) SEMICONDUCTOR INTEGRATED CIRCUIT DEVICE WITH POWER LINES IMPROVED

(75) Inventor: Yasuhiro Matsumoto, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/797,735

(22) Filed: May 7, 2007

(65) Prior Publication Data

US 2007/0273396 A1 Nov. 29, 2007

(30) Foreign Application Priority Data

May 25, 2006 (JP) ............................. 2006-145094

(51) Int. Cl.
*G01R 31/26* (2006.01)
(52) U.S. Cl. ...................... 324/763; 324/765
(58) Field of Classification Search ............... None
See application file for complete search history.

(56) References Cited

U.S. PATENT DOCUMENTS 5,898,700 A * 4/1999 Kim ........................... 714/718

6,236,224 B1 * 5/2001 Schneider .................... 324/765
6,885,212 B2 * 4/2005 Yamamoto et al. .......... 324/765
7,248,067 B2 * 7/2007 Poechmueller .............. 324/765

FOREIGN PATENT DOCUMENTS

| JP | 11-74357 | 3/1999 |
|----|----------|--------|
| JP | 2000-114324 | 4/2000 |
| JP | 2002-111007 | 4/2002 |
| JP | 2002-245796 | 8/2002 |

* cited by examiner

*Primary Examiner*—Minh N Tang
(74) *Attorney, Agent, or Firm*—McGinn IP Law Group PLLC (57) ABSTRACT

A semiconductor integrated circuit device includes an internal circuit. A plurality of power supply nodes are connected with the internal circuit, and a plurality of pads are respectively connected with the plurality of power supply nodes. A switch section is configured to connect the plurality of power supply nodes one after another in a probe test mode and to separate the plurality of power supply nodes from each other in a product use mode. A power supply voltage is applied to one of the plurality of pads in the probe test mode, and the power supply voltage is applied to each of the plurality of pads in the product use mode. The switch section may include n switches (n is a natural number) provided for the plurality of power supply nodes.

20 Claims, 10 Drawing Sheets

SEMICONDUCTOR INTEGRATED CIRCUIT DEVICE WITH POWER LINES IMPROVED

BACKGROUND OF THE INVENTION

1. Field of the Invention

The present invention relates to a semiconductor integrated circuit to which a power supply voltage is supplied.

2. Description of the Related Art

On a semiconductor wafer, a plurality of semiconductor integrated circuit devices are formed in a matrix as semiconductor chips. In each of the plurality of semiconductor integrated circuits, an internal circuit for attaining a function and electrode pads connected to the internal circuit are formed. For example, after the semiconductor integrated circuit device is produced, an electrical characteristic test is performed on the internal circuit. At this time, if it is determined to be a good product in the electrical characteristic test, a dicing process for cutting the semiconductor integrated circuit devices away from the semiconductor wafer is performed.

The electrical characteristic test includes a probe test. In the probe test, probe needles of a probe card (probe) are pushed against the electrode pads of the semiconductor integrated circuit device, to measure the electric characteristics by using a tester or a storage oscilloscope.

Figure 1:
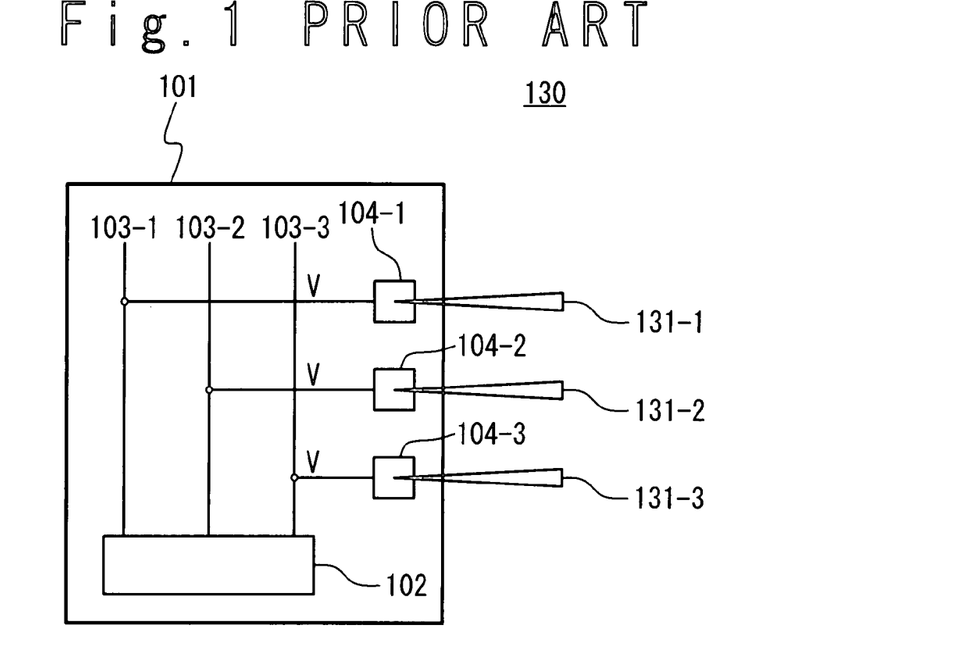
FIG. 1 shows the configuration of a conventional semiconductor system at the time of a probe test to which a semiconductor integrated circuit device is applied.

FIG. 1 shows the configuration of a conventional semiconductor system 130 at the time of the probe test to which a semiconductor integrated circuit device 101 is applied. This semiconductor system 130 has a semiconductor integrated circuit device 101 and a probe. The semiconductor integrated circuit device 101 has an internal circuit 102, a plurality of power supply nodes 103-1 to 103-3, and a plurality of bonding pads 104-1 to 104-3. The plurality of power supply nodes 103-1 to 103-3 are connected to the internal circuit 102. The plurality of power supply nodes 103-1 to 103-3 are provided as separated power supplies to reduce mutual interference between noises caused by a high speed operation of the semiconductor integrated circuit device 101. Thus, a same power supply voltage V is applied to the plurality of power supply nodes 103-1 to 103-3. The plurality of bonding pads 104-1 to 104-3 are connected to the plurality of power supply nodes 103-1 to 103-3, respectively. At the time of the probe test, probe needles 131-1 to 131-3 of the probe are pushed to the plurality of bonding pads 104-1 to 104-3, respectively. The probe supplies the power supply voltage V through the probe needles 131-1 to 131-3 to the plurality of bonding pads 104-1 to 104-3, respectively.

In accordance with this electrical characteristic test, whether or not the semiconductor integrated circuit device 101 is good is determined. As a result, in case of a good product, the dicing process for cutting the semiconductor integrated circuit device 101 away from the semiconductor wafer is performed to make it as the product.

Figure 2:
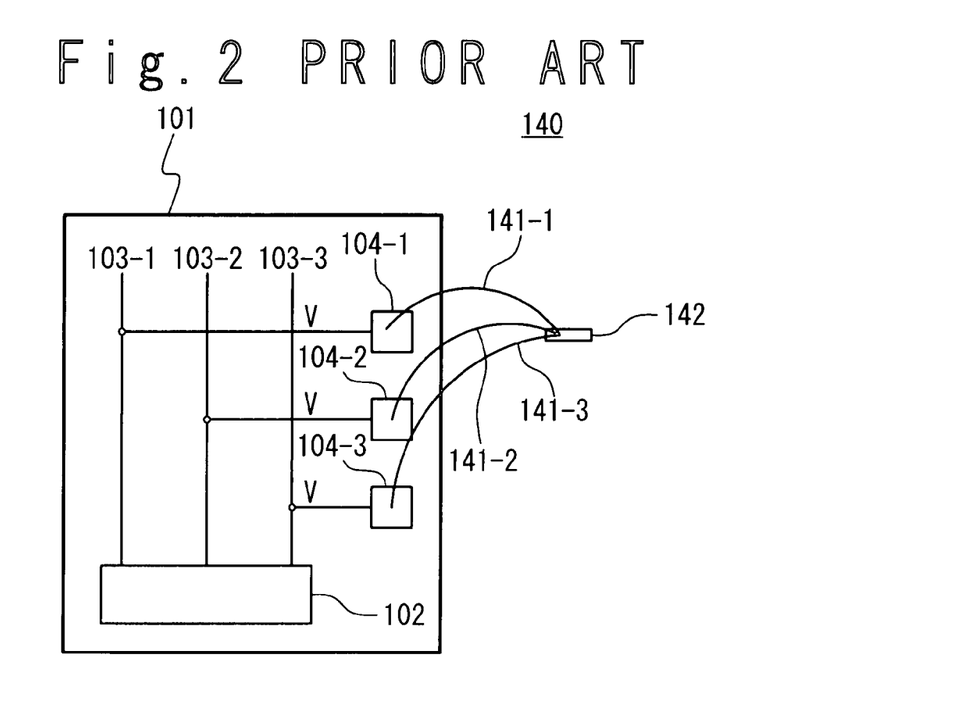
FIG. 2 shows the configuration of another conventional semiconductor system in the state of the product to which the semiconductor integrated circuit device is applied.

FIG. 2 shows the configuration of another semiconductor system 140 (in the state of the product) to which the semiconductor integrated circuit device 101 is applied. The conventional semiconductor system 140 has the semiconductor integrated circuit device 101, a plurality of bonding wires 141-1 to 141-3, and an external power supply 142. In the state of the product, the plurality of bonding wires 141-1 to 141-3 are connected to the plurality of bonding pads 104-1 to 104-3, respectively. The external power supply 142 is connected to the plurality of bonding wires 141-1 to 141-3. The external power supply 142 supplies the power supply voltage V through the plurality of bonding wires 141-1 to 141-3 to the plurality of bonding pads 104-1 to 104-3, respectively.

As mentioned above, the plurality of power supply nodes 103-1 to 103-3 are provided such that one power supply node is separated to reduce the mutual interference between the noises caused by the high speed operation of the semiconductor integrated circuit device 101, in the state of the product. However, at the time of the probe test, although the probe needles 131-1 to 131-3 are brought into contact with the plurality of bonding pads 104-1 to 104-3, respectively, the perfectly same power supply voltage V must be supplied to carry out the electrical characteristic test. The increase in the bonding pads provided in the semiconductor integrated circuit device 101 leads to the proportional increase in the probe needles to be brought into contact with them. Thus, there is a limit on the number of the probe needles that can be measured at one time in the electrical characteristic test. Also, since the probe needle is expensive, the increase in the probe needles to be used results in the increase in cost necessary for the electrical characteristic test. In this way, in the state of the product, it is desired to reduce the noise, and at the time of the probe test, it is desired to decrease the use of the probe needle.

In conjunction with the above description, Japanese Laid Open Patent Application (JP-P2002-245796A: a first conventional example) discloses a semiconductor device. This semiconductor device has a test mode and a usual mode. The semiconductor device has an internal circuit; a test circuit for outputting a control signal to the internal circuit in order to check the function of the internal circuit in the test mode; a first power supply line to supply a power supply current to the internal circuit from an external unit; and a second power supply line which is set to be active in the test mode to supply a second power supply current to the test circuit, and which is set to be inactive in the usual mode. Thus, the consumption current of a memory can be accurately measured without any influence of the consumption current of the test circuit that is used only at a time of an internal test.

Also, Japanese Laid Open Patent Application (JP-P2000-114324A: a second conventional example) discloses a probe card. The probe card is used in a test of a semiconductor device formed in a chip that has first and second pads adjacent to each other in a first direction. The probe card contains a first external circumference layer having first probe needles to be brought into contact with the first pads; and a second external circumference layer that is arranged above the first external circumference layer and has a second probe to be brought into contact with the second pads. The first and second external circumference layers are relatively movable along the first direction. Thus, it can be inspected even when an arrangement pattern of the pads and the chip size are changed.

Also, Japanese Laid Open Patent Application (JP-P2002-111007A: a third conventional example) discloses a semiconductor integrated circuit. The semiconductor integrated circuit includes a first power supply line for supplying a first voltage; a second power supply line for supplying a second voltage lower than the first voltage; a constant voltage generating circuit that is electrically connected to the first and second power supply lines; a third power supply line for supplying a constant voltage that is generated by the constant voltage generating circuit in which the first voltage is defined as a standard; and an operation circuit electrically connected to the first and third power supply lines. At least a part of transistors of the constant voltage generating circuit is formed from first field effect transistors of a partial depletion type having an SOI structure in which a body region and a source region are electrically connected and at least a part of the transistors of the operation circuit is formed from second field effect transistors of the partial depletion type having the SOI structure in which the body region is electrically in an floating state, and the threshold voltages of the first and second field effect transistors are equal. Thus, through the application based on the characteristics of the devices having the SOI structure, the super low power consumption is attained.

Also, Japanese Laid Open Patent Application (JP-A-Heisei 11-74357: a fourth conventional example) discloses an integrated circuit. The integrated circuit has a plurality of terminals. In the integrated circuit, a particular terminal or all of the terminals among the terminals are connected through a switching circuit including a selecting circuit to the power supply line and internal circuit in the integrated circuit, and each of the respective terminals is switched to a signal terminal or power supply terminal. Thus, the particular terminal or all the terminals can be used while their uses are changed to the power supply terminal or the signal terminal.

SUMMARY OF THE INVENTION

It is therefore an object of the present invention to provide a semiconductor integrated circuit device, in which in a state of a product, noise can be reduced, and at a time of a probe test, probe needles to be used can be decreased.

In a semiconductor integrated circuit device includes an internal circuit; a plurality of power supply nodes connected with the internal circuit; a plurality of pads respectively connected with the plurality of power supply nodes; and a switch section configured to connect the plurality of power supply nodes one after another in a probe test mode and to separate the plurality of power supply nodes from each other in a product use mode. A power supply voltage is applied to one of the plurality of pads in the probe test mode, and the power supply voltage is applied to each of the plurality of pads in the product use mode.

Here, the switch section may include n switches (n is a natural number) provided for the plurality of power supply nodes.

Each of the n switches may be a fuse cut before a shipping after a probe test. In this case, the fuse is a laser trim fuse and is cut through laser trimming before the shipping after the probe test.

Also, each of the n switches may be a transistor, and the transistor may be turned on in response to a control signal. The semiconductor integrated circuit device may further include a control node which is connected with a gate of each of the transistors, and to which a first control signal is supplied to turn on the transistors in the probe test mode, and a second control signal is supplied to turn off the transistors in the product use mode.

Also, (n+1) pads as the plurality of pads may be respectively connected with (n+1) power supply nodes as the plurality of power supply nodes. A j-th switch (j is a natural number meeting $1 \leq j \leq n$) may connect a j-th power supply node and a (j+1)-th power supply node in the probe test mode, and separate the j power supply node and the (j+1)-th power supply node in the product use mode. The power supply voltage may be applied to one of the (n+1) pads in the probe test mode, and the power supply voltage is applied to each of the (n+1) pads in the product use mode.

Also, (n+1) pads as the plurality of pads may be respectively connected with (n+1) power supply nodes as the plurality of power supply nodes. A j-th switch (j is a natural number meeting $1 \leq j \leq n$) may connect a first power supply node and a (j+1)-th power supply node in the probe test mode, and separate the first power supply node and the (j+1)-th power supply node in the product use mode. The power supply voltage may be applied to the first pad in the probe test mode, and the power supply voltage may be applied to each of the (n+1) pads in the product use mode.

In another aspect of the present invention, a semiconductor integrated circuit system, includes a semiconductor integrated circuit device which includes an internal circuit, a plurality of power supply nodes connected with the internal circuit, a plurality of bonding pads respectively connected with the plurality of power supply nodes, and a switch section configured to connect the plurality of power supply nodes one after another in a probe test mode to separate the plurality of power supply nodes from each other in a product. A semiconductor integrated circuit system further include an external power supply configured to generate a power supply voltage; and a probe configured to apply the power supply voltage from the external power supply to one of the plurality of bonding pads in the probe test mode. The external power supply is connoted to the plurality of bonding pads through a plurality of bonding wires in the product to supply the power supply voltage to the plurality of bonding wires.

Here, the switch section may include n switches (n is a natural number) provided for the plurality of power supply nodes.

Also, each of the n switches may be a fuse cut before a shipping after a probe test. In this case, the fuse may be a laser trim fuse and is cut through laser trimming before the shipping after the probe test.

Also, each of the n switches is a transistor, and the transistor is turned on in response to a control signal. In this case, the semiconductor integrated circuit system may further include a control node which is connected with a gate of each of the transistors, and to which a first control signal is supplied to turn on the transistors in the probe test mode, and a second control signal is supplied to turn off the transistors in the product use mode.

Also, (n+1) pads as the plurality of pads may be respectively connected with (n+1) power supply nodes as the plurality of power supply nodes. A j-th switch (j is a natural number meeting $1 \leq j \leq n$) may connect a j-th power supply node and a (j+1)-th power supply node in the probe test mode, and separate the j power supply node and the (j+1)-th power supply node in the product use mode. The power supply voltage may be applied to one of the (n+1) pads in the probe test mode, and the power supply voltage is applied to each of the (n+1) pads in the product use mode.

Also, (n+1) pads as the plurality of pads may be respectively connected with (n+1) power supply nodes as the plurality of power supply nodes. A j-th switch (j is a natural number meeting $1 \leq j \leq n$) may connect a first power supply node and a (j+1)-th power supply node in the probe test mode, and separate the first power supply node and the (j+1)-th power supply node in the product use mode. The power supply voltage is applied to the first pad in the probe test mode, and the power supply voltage is applied to each of the (n+1) pads in the product use mode.

In still another aspect of the present invention, a method of applying a power supply voltage to a semiconductor integrated circuit device which includes an internal circuit; a plurality of power supply nodes connected with the internal circuit; a plurality of pads respectively connected with the plurality of power supply nodes; and a switch section configured to connect the plurality of power supply nodes one after another in a probe test mode and to separate the plurality of power supply nodes from each other in a product. The method may be achieved by applying a power supply voltage to one of the plurality of pads in the probe test mode; and by applying the power supply voltage to each of the plurality of pads in the product use mode.

As mentioned above, the plurality of power supply nodes are designed such that a single power supply node is separated in order to reduce the mutual interference between the noises caused by the high speed operation of a semiconductor integrated circuit. However, the electrical characteristic test is carried out in the situation that the semiconductor integrated circuit is formed on a semiconductor wafer. Thus, the high speed operation is not required for the semiconductor integrated circuit. For this reason, at the time of the probe test in the electrical characteristic test, each of the plurality of power supply nodes is connected through a switch. Thus, it is adequate to bring one probe needle into contact with one bonding pad among a plurality of bonding pads. Hence, the use of the probe needle can be decreased.

On the other hand, in the state of the product, the switch separates each of the plurality of power supply nodes. Thus, it is possible to reduce the mutual interference between the noises caused by the high speed operation of the semiconductor integrated circuit. In this way, according to the present invention, in the state of the product, the noise can be reduced, and at the time of the probe test, the use of the probe needle can be decreased.

DESCRIPTION OF THE PREFERRED EMBODIMENTS

Hereinafter, a semiconductor integrated circuit of the present invention will be described in detail with reference to the attached drawings.

First Embodiment

Figure 3:
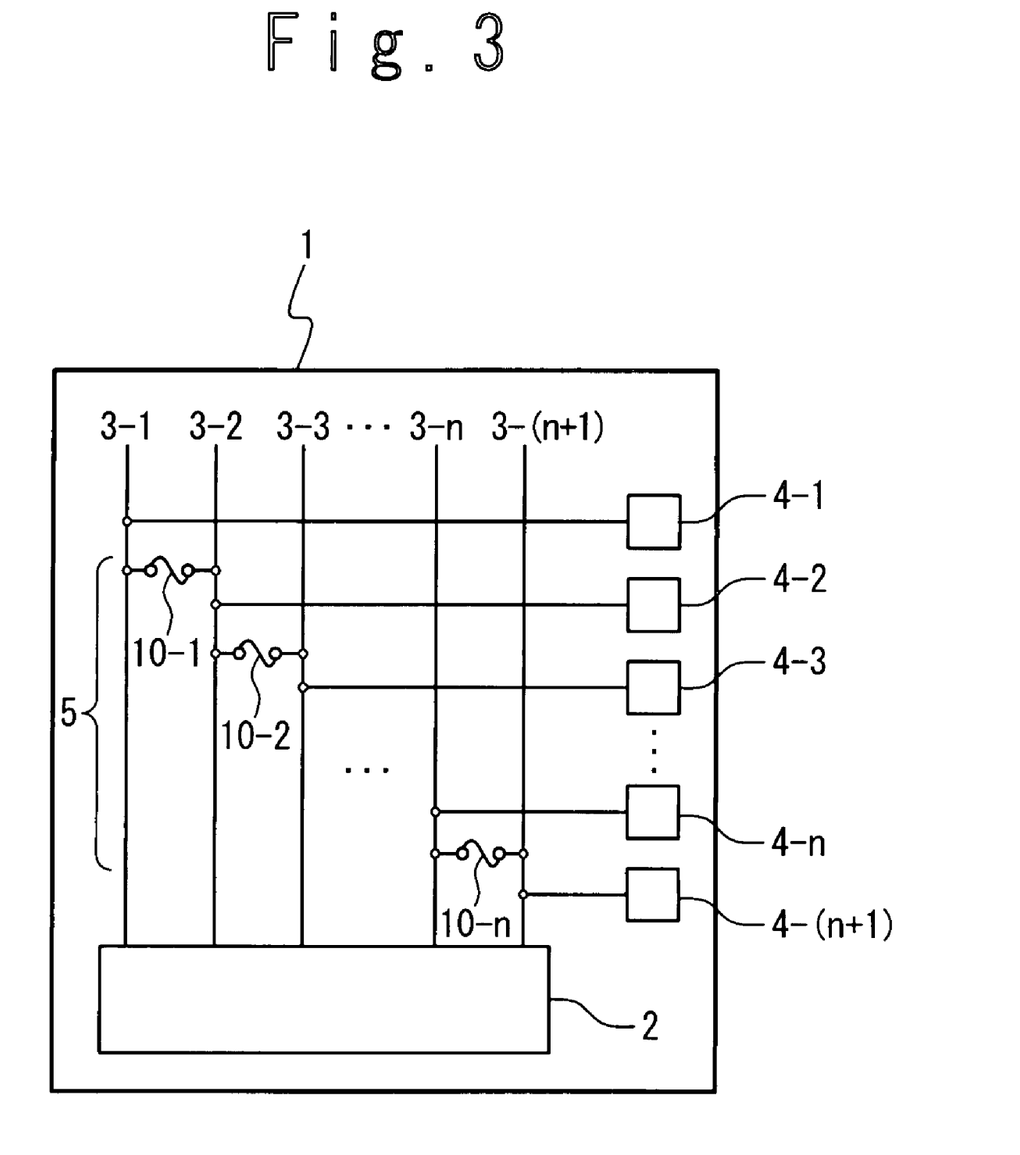
FIG. 3 shows the configuration of a semiconductor integrated circuit device according to a first embodiment of the present invention.

FIG. 3 shows the configuration of a semiconductor integrated circuit device 1 according to the first embodiment of the present invention. The semiconductor integrated circuit device 1 according to the first embodiment has an internal circuit 2, a plurality of power supply nodes 3-1 to 3-(n+1), a plurality of bonding pads 4-1 to 4-(n+1), and a switch unit 5. Here, n is a natural integer.

The plurality of power supply nodes 3-1 to 3-(n+1) are connected to the internal circuit 2. The plurality of power supply nodes 3-1 to 3-(n+1) are designed such that a single power supply node is separated to reduce mutual interference between noises caused by a high speed operation of the semiconductor integrated circuit device 1, when they are produced to a state of products. Thus, a same power supply voltage V is applied to the plurality of power supply nodes 3-1 to 3-(n+1). The plurality of bonding pads 4-1 to 4-(n+1) are connected to the plurality of power supply nodes 3-1 to 3-(n+1), respectively. The switch unit 5 connects the plurality of power supply nodes 3-1 to 3-(n+1) at the time of the probe test (in a test mode) and separates the plurality of power supply nodes 3-1 to 3-(n+1) in the state of the product (in a product use mode). For example, the switch unit 5 has n switches 10-1 to 10-n. The n switches 10-1 to 10-n are fuses such as laser trimming fuses. Therefore, the laser trimming fuse 10-j (j is a natural number satisfying $1 \leq j \leq n$) connects the power supply node 3-j and the power supply node 3-(j+1) at the time of the probe test and separates the power supply node 3-j and the power supply node 3-(j+1) in the state of the product.

Figure 4:
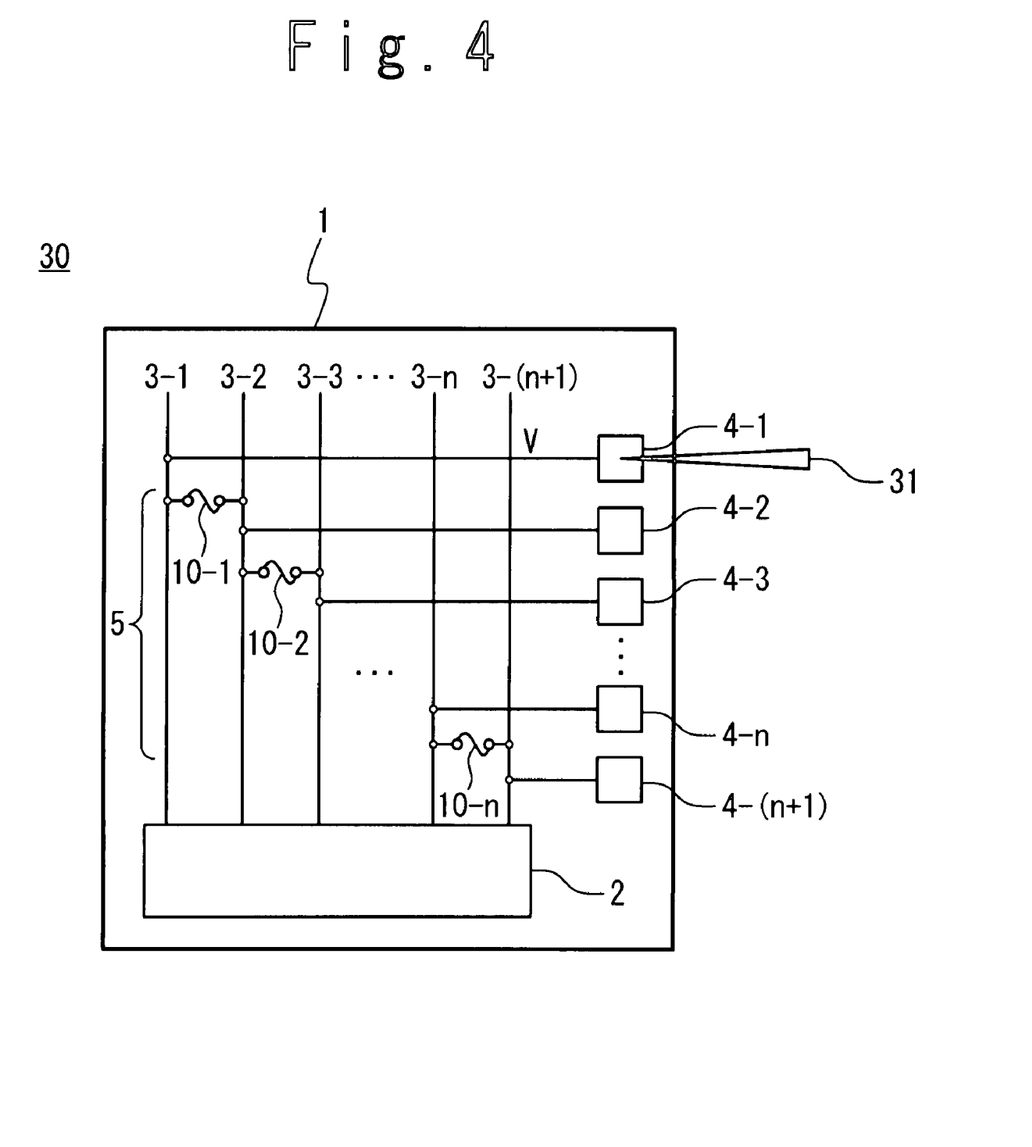
FIG. 4 shows the configuration of a semiconductor system in the state of the product to which the semiconductor integrated circuit device is applied.

FIG. 4 shows the configuration of a semiconductor system 30 in the state of the product to which the semiconductor integrated circuit device 1 is applied. This semiconductor system 30 has the semiconductor integrated circuit device 1 and a probe card (probe). At the time of the probe test, a probe needle 31 is pushed onto the bonding pad 4-1 as one of the plurality of bonding pads 4-1 to 4-(n+1). The probe supplies a power supply voltage V to the bonding pad 4-1 through the probe needle 31.

Figure 5:
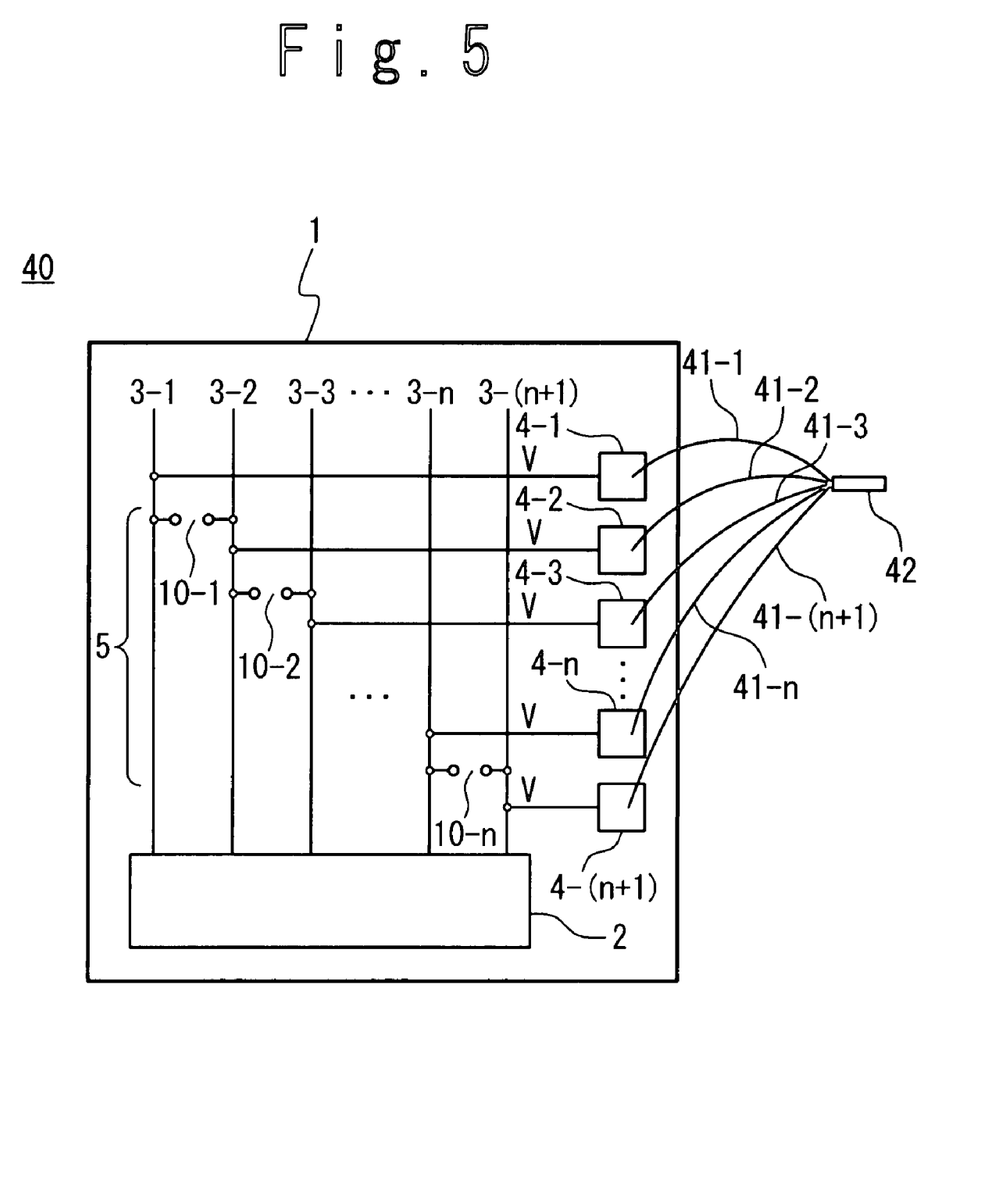
FIG. 5 shows the configuration of a semiconductor system in the state of the product to which the semiconductor integrated circuit device is applied.

FIG. 5 shows the configuration of a semiconductor system 40 in the state of the product to which the semiconductor integrated circuit device 1 is applied. This semiconductor system 40 has the semiconductor integrated circuit device 1, a plurality of bonding wires 41-1 to 41-(n+1), and an external power supply 42. In the state of the product, the plurality of bonding wires 41-1 to 41-(n+1) are connected to the plurality of bonding pads 4-1 to 4-(n+1), respectively. The external power supply 42 is connected to the plurality of bonding wires 41-1 to 41-(n+1). The external power supply 42 supplies the power supply voltage V through the plurality of bonding wires 41-1 to 41-(n+1) to the plurality of bonding pads 4-1 to 4-(n+1).

Figure 6:
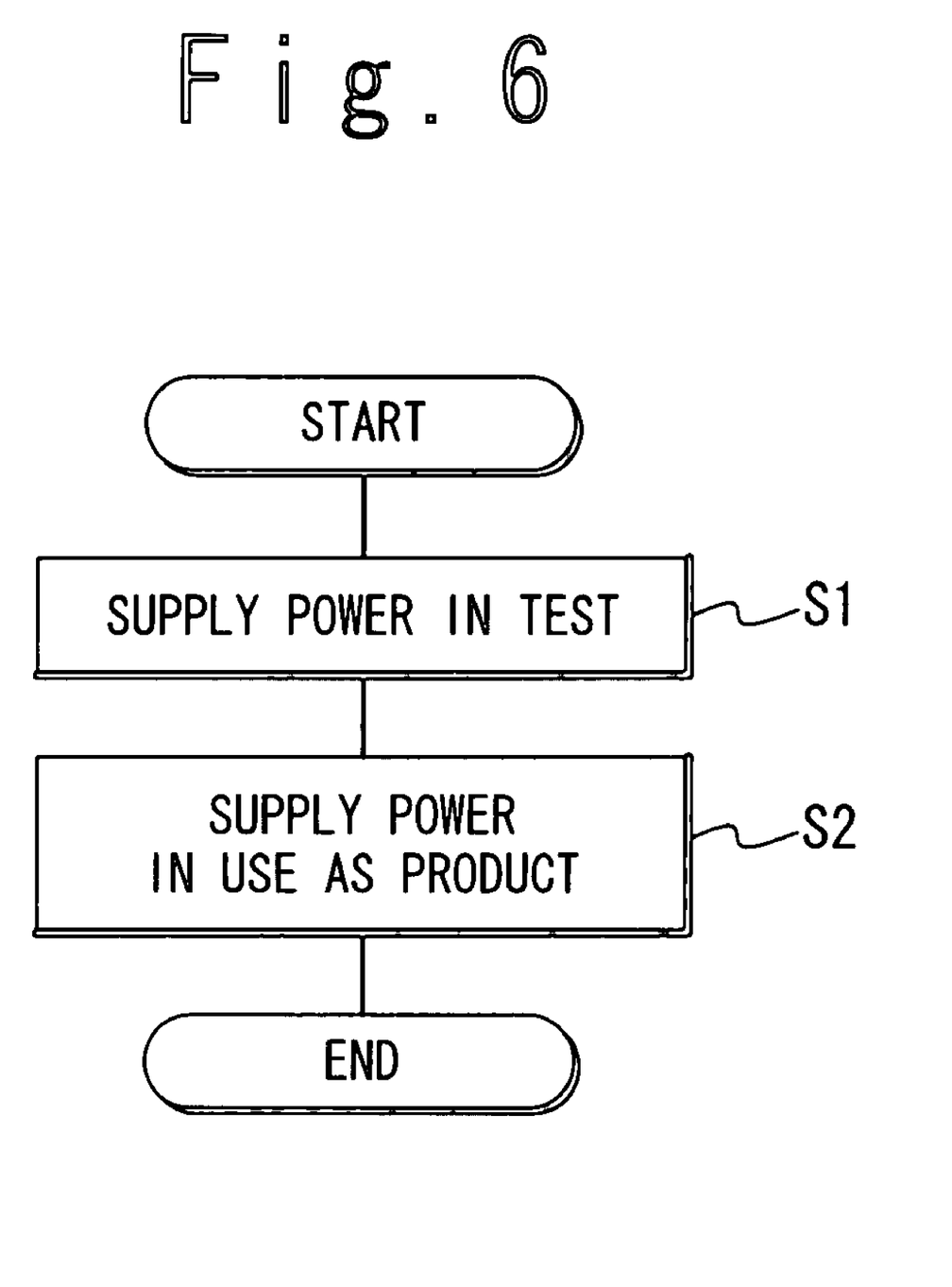
FIG. 6 is a flowchart showing an operation of semiconductor system to which the semiconductor integrated circuit of the present invention is applied.

The operations of the semiconductor systems 30 and 40 to which the semiconductor integrated circuit device 1 of the present invention is applied will be described, referring to FIG. 6.

At first, the plurality of semiconductor integrated circuit devices 1 are formed in a matrix as semiconductor chips on a semiconductor wafer. After the semiconductor integrated circuit device 1 is produced, the probe test as the electrical characteristic test is performed on the internal circuit 2 of the semiconductor integrated circuit device 1 (Step S1).

At the step S1, the switch unit 5 connects each of the plurality of power supply nodes 3-1 to 3-(n+1). That is, the laser trimming fuse 10-j ($1 \leq j \leq n$) of the switch unit 5 connects the power supply node 3-j and the power supply node 3-(j+1). Consequently, the probe supplies the power supply voltage V through one probe needle 40 to one bonding pad 4-1 of the plurality of bonding pads 4-1 to 4-(n+1). In accordance with this electrical characteristic test, whether or not the semiconductor integrated circuit device 1 is the good product is determined. As a result, in case of the good product, a dicing process for cutting the semiconductor integrated circuit device 1 away from the semiconductor wafer is performed to complete the product (Step S2).

At the step S2, the switch unit 5 opens the plurality of power supply nodes 3-1 to 3-(n+1). In this case, the n laser trimming fuses 10-1 to 10-n are cut away by laser trimming. That is, the laser trimming fuse 10-j ($1 \leq j \leq n$) separates the power supply node 3-j and the power supply node 3-(j+1). Thus, the external power supply 42 supplies the power supply voltage V through the plurality of bonding wires 41-1 to 41-(n+1) to the plurality of bonding pads 4-1 to 4-(n+1), respectively.

In the semiconductor integrated circuit device 1 according to the first embodiment of the present invention, as mentioned above, the plurality of power supply nodes 3-1 to 3-(n+1) are designed such that a single power supply node is separated to reduce the mutual interference between the noises caused by the high speed operation of the semiconductor integrated circuit device 1 in the state of the product.

However, the electrical characteristic test is performed in the situation that the semiconductor integrated circuit device 1 is formed on the semiconductor wafer. Thus, a high speed operation is not required for the semiconductor integrated circuit device 1. For this reason, at the time of the probe test in the electrical characteristic test, the plurality of power supply nodes 3-1 to 3-(n+1) is connected through the switch unit 5. Thus, it is adequate to bring one probe needle 40 into contact with one bonding pad 4-1 of the plurality of bonding pads 4-1 to 4-(n+1). Therefore, the use of the probe needle can be decreased. On the other hand, in the state of the product, the switch unit 5 separates the plurality of power supply nodes 3-1 to 3-(n+1). Thus, it is possible to reduce the mutual interference between the noises caused by the high speed operation of the semiconductor integrated circuit device 1. In this way, according to the semiconductor integrated circuit device 1 according to the first embodiment of the present invention, the noise can be reduced in the state of the product, and the probe needles to be used can be decreased at the time of the probe test.

Second Embodiment

Figure 7:
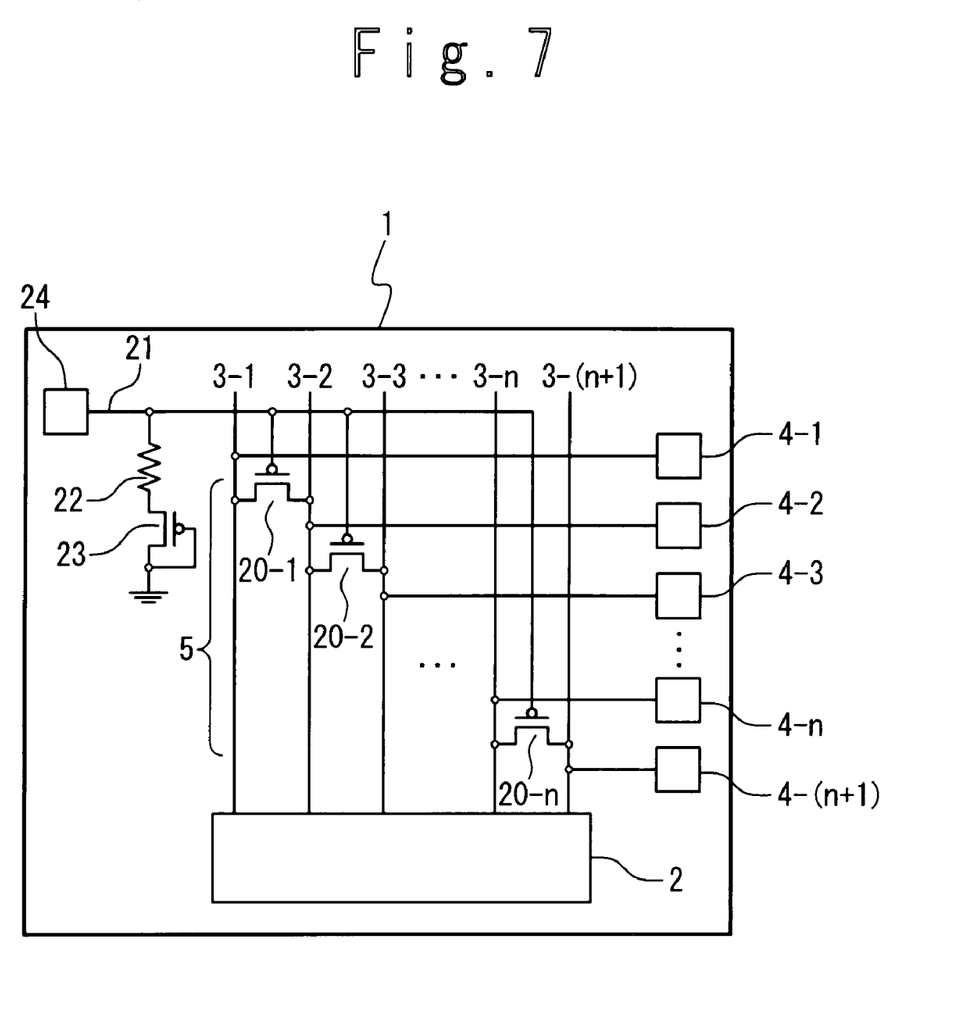
FIG. 7 shows the configuration of the semiconductor integrated circuit device according to the second embodiment of the present invention.

FIG. 7 shows the configuration of the semiconductor integrated circuit device 1 according to the second embodiment of the present invention. The semiconductor integrated circuit device 1 according to the second embodiment has the internal circuit 2, the plurality of power supply nodes 3-1 to 3-(n+1), the plurality of bonding pads 4-1 to 4-(n+1), the switch unit 5, and a switch controller. Here, n is a natural number.

The plurality of power supply nodes 3-1 to 3-(n+1) are connected to the internal circuit 2. The plurality of power supply nodes 3-1 to 3-(n+1) are designed such that a single power supply node is separated in order to reduce the mutual interference between the noises caused by the high speed operation, when the semiconductor integrated circuit device 1 is produced in the state of the product. Thus, the same power supply voltage V is applied to the plurality of power supply nodes 3-1 to 3-(n+1). The plurality of bonding pads 4-1 to 4-(n+1) are connected to the plurality of power supply nodes 3-1 to 3-(n+1), respectively. The switch unit 5 connects the plurality of power supply nodes 3-1 to 3-(n+1) one after another at the time of the probe test and separates the plurality of power supply nodes 3-1 to 3-(n+1) from each other in the state of the product. For example, the switch unit 5 has n switches 20-1 to 20-n. As the n switches 20-1 to 20-n, P-type transistors are exemplified.

In this way, a source of a P-type transistor 20-j (j is a natural number satisfying $1 \leq j \leq n$) is connected to the power supply node 3-j, and a drain of the P-type transistor 20-j is connected to the power supply node 3-(j+1). A gate of the P-type transistor 20-j is connected to the switch controller, and in response to a control signal from the switch controller, the P-type transistor 20-j is turned on at the time of the probe test and turned off in the state of the product. That is, the P-type transistor 20-j connects the power supply node 3-j and the power supply node 3-(j+1) at the time of the probe test and separates the power supply node 3-j and the power supply node 3-(j+1) in the state of the product.

The switch controller has a control node 21, a resistor element 22, a P-type transistor 23 for grounding and a control bonding pad 24. The control node 21 is connected to the gates of transistors 20-1 to 20-n and connected through the resistor element 22 to the source of the ground P-type transistor 23. The gate and drain of the P-type transistor 23 are grounded. The control bonding pad 24 is connected to the control node 21. Here, when a resistor value of the resistor element 22 is assumed to be sufficiently large, the control node 21 is fixed through the resistor element 22 to a ground voltage GND when the control bonding pad 24 is opened. Also, when the power supply voltage V is applied to the control bonding pad 24, the control node 21 is set to the voltage.

Figure 8:
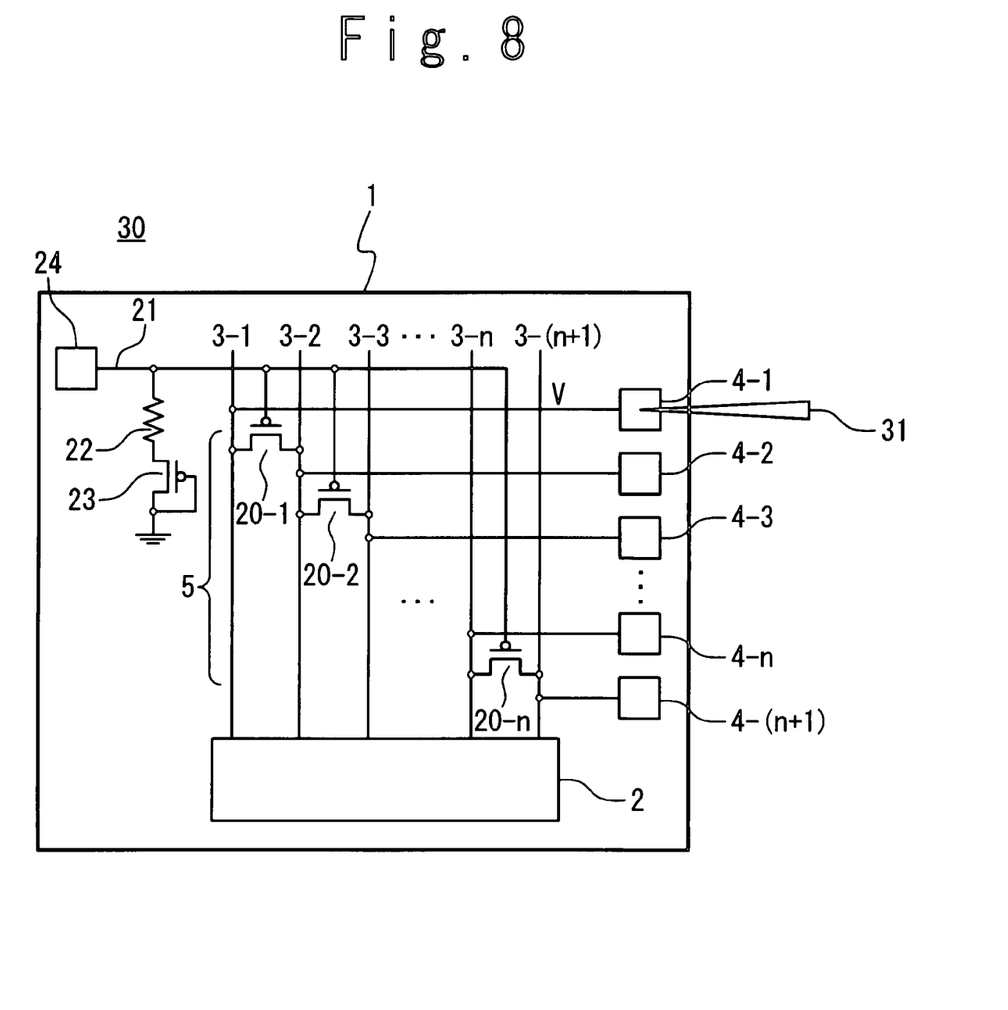
FIG. 8 shows the configuration of the semiconductor system at the time of the probe test to which the semiconductor integrated circuit device is applied.

FIG. 8 shows the configuration of the semiconductor system 30 at the time of the probe test to which the semiconductor integrated circuit device 1 is applied. This semiconductor system 30 has the semiconductor integrated circuit device 1 and a probe card (probe). At the time of the probe test, the probe needle 31 of the probe is brought into contact with on the bonding pad 4-1 as one bonding pad among the plurality of bonding pads 4-1 to 4-(n+1). The probe supplies the power supply voltage V through the probe needle 31 to the bonding pad 4-1.

Figure 9:
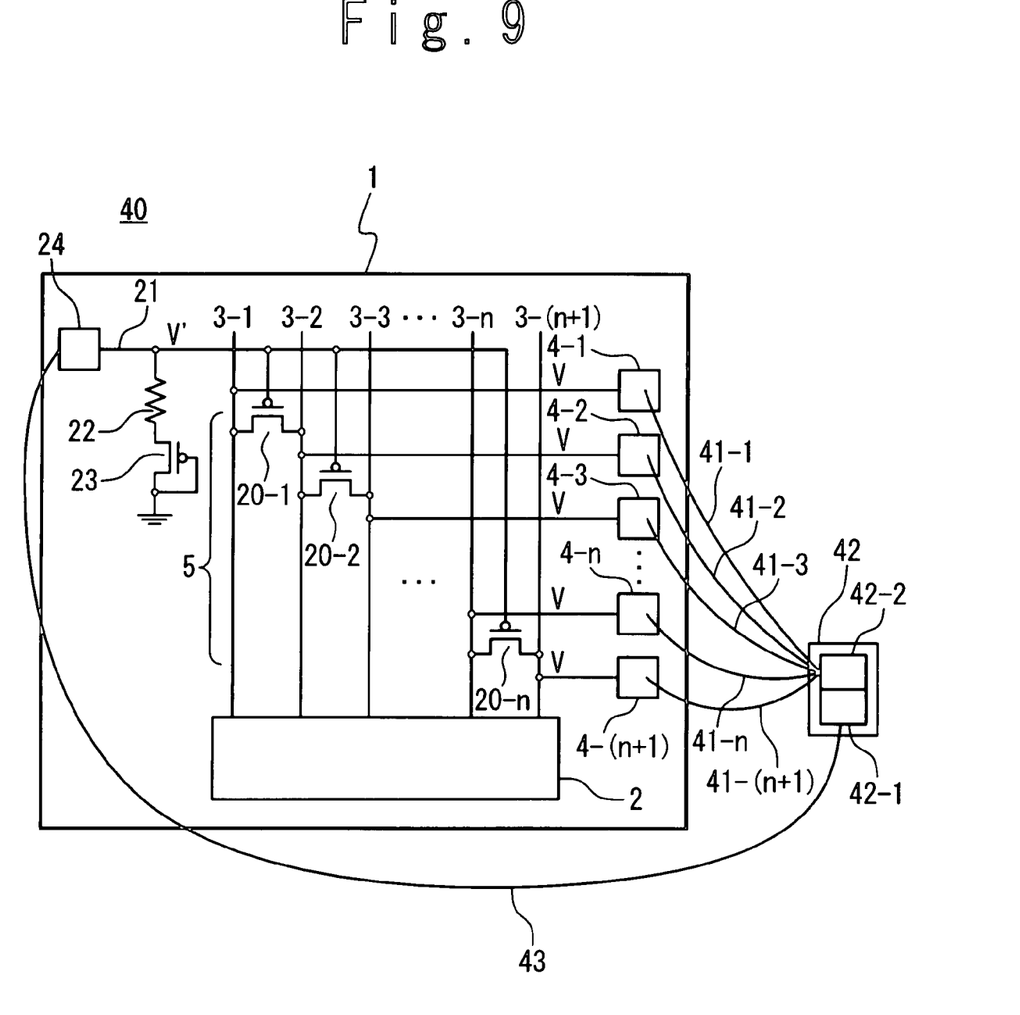
FIG. 9 shows the configuration of the semiconductor system in the state of the product to which the semiconductor integrated circuit device is applied.

FIG. 9 shows the configuration of the semiconductor system 40 in the state of the product to which the semiconductor integrated circuit device 1 is applied. The semiconductor system 40 has the semiconductor integrated circuit device 1, the plurality of bonding wires 41-1 to 41-(n+1), the external power supply 42 and a bonding wire 43. The external power supply 42 has a housing, an active power supply unit 42-1 provided inside the housing, and a supplying unit 42-2. The housing is grounded and sends a first control signal to turn on the transistors 20-1 to 20-n at the time of the probe test as the control signal to the control node 21. In this case, this first control signal is the ground voltage GND.

In the state of the product, the bonding wire 43 is connected to the control bonding pad 24. The active power supply unit 42-1 is connected to the bonding wire 43. The active power supply unit 42-1 sends a second control signal to turn off the transistors 20-1 to 20-n as the control signal, through the bonding wire 43 to the control bonding pad 24. This second control signal is a power supply voltage V' exceeding threshold voltages of the P-type transistors 20-1 to 20-n. However, if the power supply voltage V also exceeds the threshold voltage, the power supply voltage V' may be equal to the power supply voltage V.

Also, in the state of the product, the plurality of bonding wires 41-1 to 41-(n+1) are connected to the plurality of bonding pads 4-1 to 4-(n+1), respectively. The supplying unit 42-2 is connected to the plurality of bonding wires 41-1 to 41-(n+1). The supplying unit 42-2 supplies the power supply voltage V through the plurality of bonding wires 41-1 to 41-(n+1) to the plurality of bonding pads 4-1 to 4-(n+1), respectively.

The semiconductor systems 30 and 40 to which the semiconductor integrated circuit device 1 of the present invention is applied will be described with reference to FIG. 6.

At first, the plurality of semiconductor integrated circuit devices 1 as semiconductor chips are formed on the semiconductor wafer in a matrix. After the semiconductor integrated circuit device 1 is produced, the probe test as the electrical characteristic test is performed on the internal circuit 2 of the semiconductor integrated circuit device 1 (Step S1).

At the step S1, if the control bonding pad 24 is set to be in the opened state, the ground voltage GND equal to the voltage of the housing (as the inactive power supply unit) of the external power supply 42 is supplied as the first control signal through the P-type transistor 23 and the resistor element 22 to the control node 21. In this case, the switch unit 5 connects the plurality of power supply nodes 3-1 to 3-(n+1) one after another. That is, the P-type transistor 20-j ($1 \leq j \leq n$) of the switch unit 5 is turned on in accordance with the first control signal and connects the power supply node 3-j and the power supply node 3-(j+1). Thus, the probe supplies the power supply voltage V through one probe needle 40 to one bonding pad 4-1 among the plurality of bonding pads 4-1 to 4-(n+1).

In accordance with the electrical characteristic test, whether or not the semiconductor integrated circuit device 1 is the good product is determined. As a result, in case of the good product, the dicing process for cutting the semiconductor integrated circuit device 1 away from the semiconductor wafer is perform to produce a product (Step S2).

At the step S2, the active power supply unit 42-1 of the external power supply 42 supplies the power supply voltage V' as the second control signal through the bonding wire 43 to the control bonding pad 24. In this case, the switch unit 5 separates the plurality of power supply nodes 3-1 to 3-(n+1) from each other. That is, the P-type transistor 20-j ($1 \leq j \leq n$) of the switch unit 5 is turned off in accordance with the second control signal and separates the power supply node 3-j and the power supply node 3-(j+1). Thus, the supplying unit 42-2 of the external power supply 42 supplies the power supply voltage V through the plurality of bonding wires 41-1 to 41-(n+1) to the plurality of bonding pads 4-1 to 4-(n+1), respectively.

In the semiconductor integrated circuit device 1 according to the first embodiment of the present invention, as mentioned above, the plurality of power supply nodes 3-1 to 3-(n+1) are designed such that the single power supply node is separated in order to reduce the mutual interference between the noises caused by the high speed operation of the semiconductor integrated circuit device 1 in the state of the product. However, the electrical characteristic test is performed in the situation that the semiconductor integrated circuit device 1 is formed on the semiconductor wafer. Thus, the high speed operation is not required for the semiconductor integrated circuit device 1. For this reason, each of the plurality of power supply nodes 3-1 to 3-(n+1) is connected through the switch unit 5 at the time of the probe test in the electrical characteristic test. Thus, it is adequate to bring one probe needle 40 into contact with one bonding pad 4-1 among the plurality of bonding pads 4-1 to 4-(n+1). Therefore, the use of the probe needle can be decreased.

On the other hand, in the state of the product, the switch unit 5 separates the plurality of power supply nodes 3-1 to 3-(n+1) from each other. Thus, it is possible to reduce the mutual interference between the noises caused by the high speed operation of the semiconductor integrated circuit device 1.

In this way, according to the semiconductor integrated circuit device 1 according to the second embodiment of the present invention, the noise can be reduced in the state of the product, and the probe needle to be used can be decreased at the time of the probe test.

Third Embodiment

Figure 10:
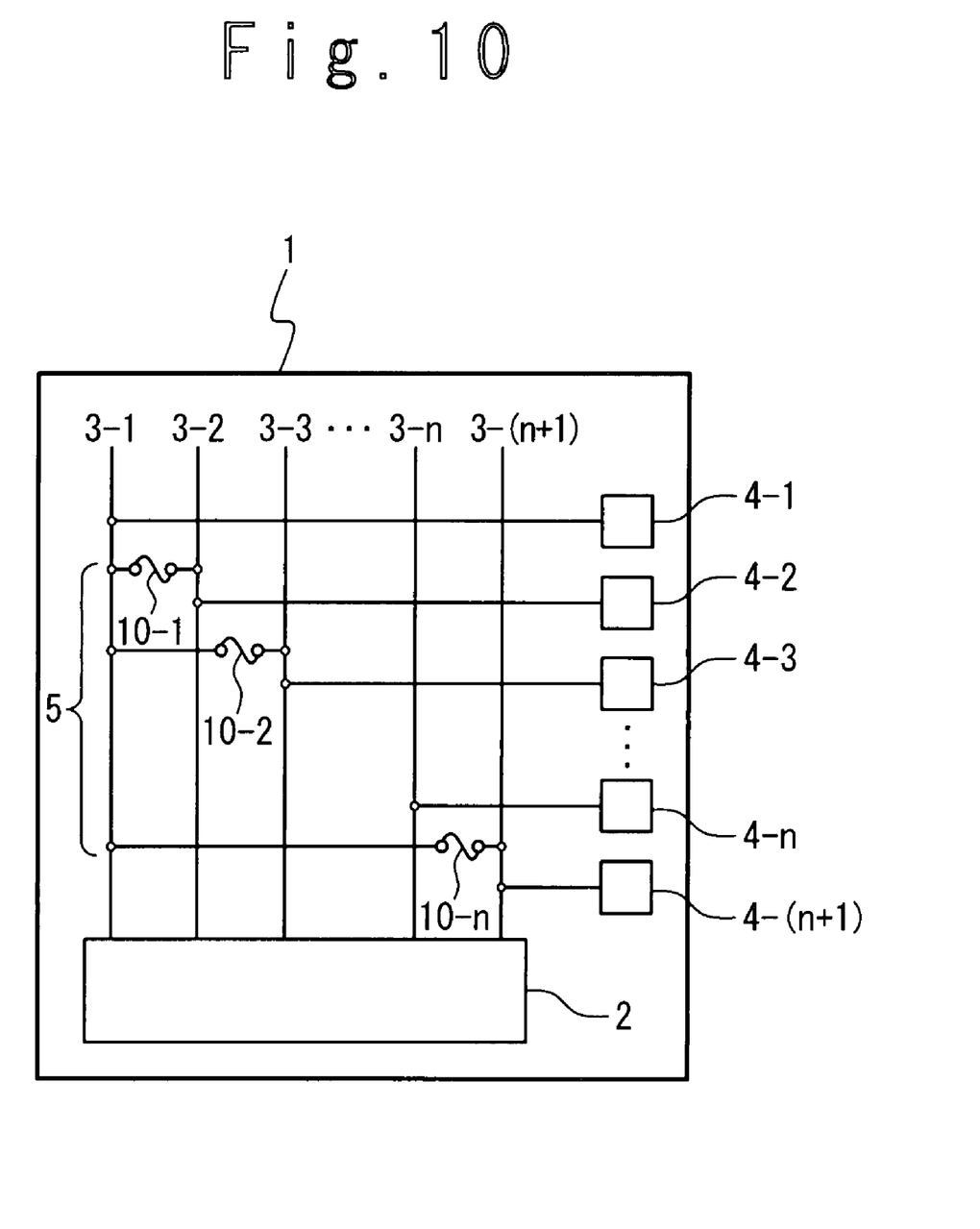
FIG. 10 shows the configuration of the semiconductor integrated circuit device according to the third embodiment of the present invention.

In the third embodiment, only the point different from the first embodiment will be described. FIG. 10 shows the configuration of the semiconductor integrated circuit device 1 according to the third embodiment of the present invention. The semiconductor integrated circuit device 1 according to the third embodiment has the same configuration as that of the first embodiment. However, the connection relation between the laser trimming fuses 10-1 to 10-n of the switch unit 5 differs from that of the first embodiment. For example, the laser trimming fuse 10-j (j is the integer satisfying $1 \leq j \leq n$) may connect the power supply node 3-1 and the power supply node 3-(j+1) at the time of the probe test and separate the power supply node 3-1 and the power supply node 3-(j+1) in the state of the product.

Fourth Embodiment

Figure 11:
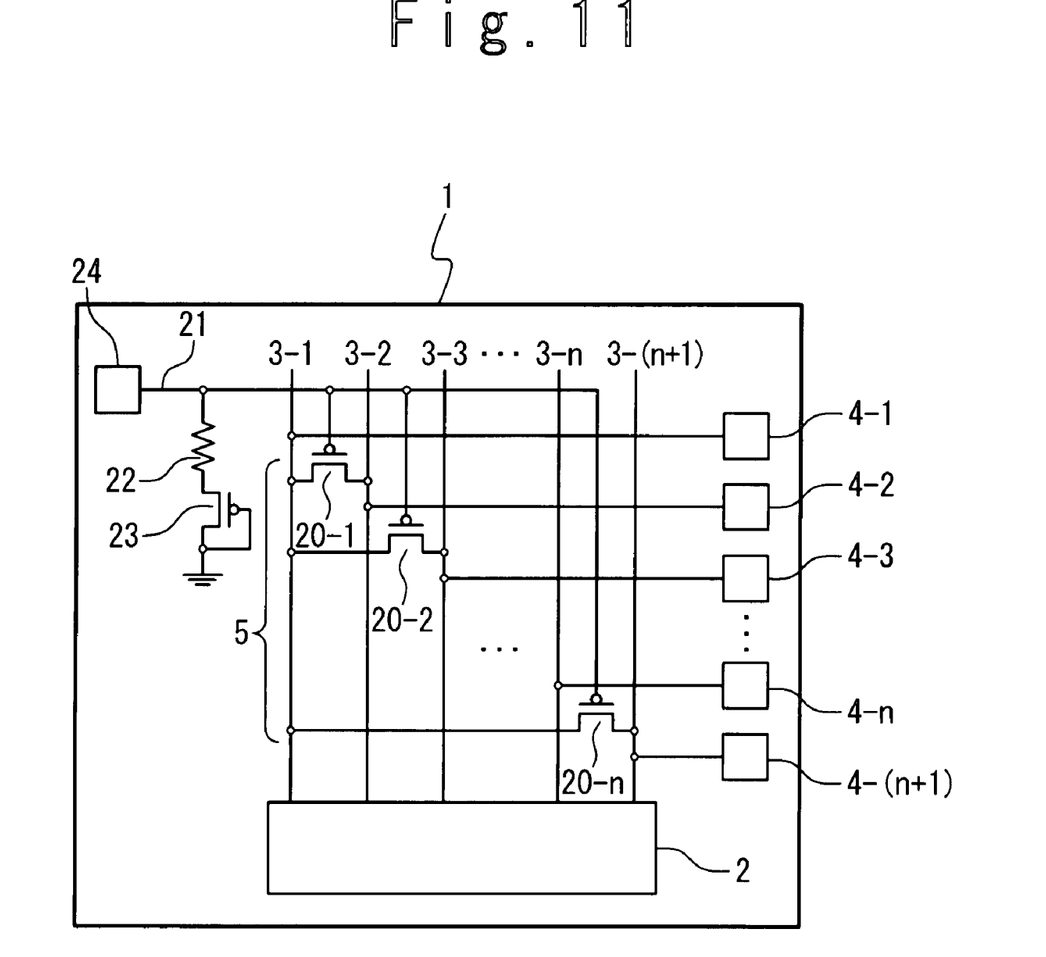
FIG. 11 shows the configuration of the semiconductor integrated circuit device 1 according to the fourth embodiment of the present invention.

In the fourth embodiment, only the point different from the second embodiment will be described. FIG. 11 shows the configuration of the semiconductor integrated circuit device 1 according to the fourth embodiment of the present invention. The semiconductor integrated circuit device 1 according to the fourth embodiment has the same configuration as that of the second embodiment. However, the connection relation of the P-type transistors 20-1 to 20-n of the switch unit 5 differs from that of the first embodiment. For example, the P-type transistor 20-j (j is the integer satisfying $1 \leq j \leq n$) may connect the power supply node 3-1 and the power supply node 3-(j+1) at the time of the probe test and separate the power supply node 3-1 and the power supply node 3-(j+1) in the state of the product.

What is claimed is:

1. A semiconductor integrated circuit device, comprising:
   an internal circuit;
   a plurality of power supply nodes connected with said internal circuit; and
   a switch section configured to connect said plurality of power supply nodes with each other in a probe test mode and to separate said plurality of power supply nodes from each other in a product use mode,
   where voltages at the plurality of power supply nodes are substantially the same as each other in the product use mode.

2. The semiconductor integrated circuit device according to claim 1, wherein said switch section comprises n switches (n is a natural number) provided for said plurality of power supply nodes.

3. The semiconductor integrated circuit device according to claim 2, wherein said switches comprise fuses cut in said product use mode.

4. The semiconductor integrated circuit device according to claim 3, wherein said fuses comprise laser trim fuses.

5. The semiconductor integrated circuit device according to claim 2, wherein each of said n switches comprises a transistor, and said transistor is turned on in response to a control signal.

6. The semiconductor integrated circuit device according to claim 5, further comprising a control node which is connected with a gate of each of said transistors, and to which a first control signal is supplied to turn on said transistors in said probe test mode, and a second control signal is supplied to turn off said transistors in said product use mode.

7. The semiconductor integrated circuit device according to claim 2, wherein said plurality of power supply nodes comprise (n+1) power supply nodes, a j-th switch (j is a natural number meeting $1 \leq j \leq n$) connects a j-th power supply node and a (j+1)-th power supply node in said probe test mode, and separates said j-th power supply node and said (j+1)-th power supply node in said product use mode, and
wherein a power supply voltage is applied to one of (n+1) pads, each of the pads being associated with a respective one of the power supply nodes, in said probe test mode, and said power supply voltage is applied to each of said (n+1) pads in said product use mode.

8. The semiconductor integrated circuit device according to claim 2, wherein as said plurality of power supply nodes comprise (n+1) power supply nodes as,
a j-th switch (j is a natural number meeting $1 \leq j \leq n$) connects a (j) power supply node of the power supply nodes and a (j+1)-th power supply node of the power supply nodes in said probe test mode, and separates said (j) power supply node and said (j+1)-th power supply node in said product use mode,
a power supply voltage is applied to a first pad in said probe test mode, and said power supply voltage is applied to each of (n+1) pads in said product use mode, each of the pads being associated with a respective one of the power supply nodes.

9. A semiconductor integrated circuit system, comprising:
a semiconductor integrated circuit device, comprising:
an internal circuit;
a plurality of power supply nodes connected with said internal circuit;
a plurality of pads respectively connected with said plurality of power supply nodes; and
a switch section configured to connect said plurality of power supply nodes each other in a probe test mode and to separate said plurality of power supply nodes from each other in a product use mode; and
an external power supply supplying a power supply voltage to said plurality of pads in said product use mode such that voltages at the plurality of power supply nodes are substantially the same as each other.

10. The semiconductor integrated circuit system according to claim 9, wherein said switch section comprises n switches (n is a natural number) provided for said plurality of power supply nodes.

11. The semiconductor integrated circuit system according to claim 10, wherein said switches comprise fuses cut in said product use mode.

12. The semiconductor integrated circuit system according to claim 11, wherein said fuses comprise laser trim fuses.

13. The semiconductor integrated circuit system according to claim 10, wherein each of said n switches comprises a transistor, and said transistor is turned on in response to a control signal.

14. The semiconductor integrated circuit system according to claim 13, further comprising a control node which is connected with a gate of each of said transistors, and to which a first control signal is supplied to turn on said transistors in said probe test mode, and a second control signal is supplied to turn off said transistors in said product use mode.

15. The semiconductor integrated circuit device according to claim 10, wherein said plurality of power supply nodes comprise (n+1) power supply nodes,
a j-th switch (j is a natural number meeting $1 \leq j \leq n$) connects a j-th power supply node and a (j+1)-th power supply node in said probe test mode, and separates the j-th power supply node and said (j+1)-th power supply node in said product use mode,
said power supply voltage is applied to one of said (n+1) pads in said probe test mode, and said power supply voltage is applied to each of said (n+1) pads in said product use mode.

16. The semiconductor integrated circuit device according to claim 10, wherein said plurality of power supply nodes comprise (n+1) power supply nodes,
a j-th switch (j is a natural number meeting $1 \leq j \leq n$) connects one of said plurality of power supply nodes and a (j+1)-th power supply node in said probe test mode, and separates said one of said plurality power supply nodes and said (j+1)-th power supply node in said product use mode,
said power supply voltage is applied to the first pad in said probe test mode, and said power supply voltage is applied to each of said (n+1) pads in said product use mode.

17. A method of applying a power supply voltage to a semiconductor integrated circuit device which
an internal circuit;
a plurality of power supply nodes connected with said internal circuit;
a plurality of pads respectively connected with said plurality of power supply nodes; and
a switch section configured to connect said plurality of power supply nodes each other in a probe test mode and to separate said plurality of power supply nodes from each other in a product use mode, said method comprising:
applying a first power supply voltage to a selected one of said plurality of pads without applying said power voltage to remaining one or ones of said plurality of pads in said probe test mode; and
applying a second power supply voltage to each of said plurality of pads in said product use mode such that voltages at the plurality of power supply nodes are substantially the same as each other.

18. The semiconductor integrated circuit system according to claim 9, wherein the external power supply is connected to said plurality of pads through a plurality of wires.

19. The method of claim 17, wherein said applying a first power supply voltage comprises applying said first power supply voltage to one of said plurality of pads without applying said power supply voltage to the other of said plurality pads.

20. The method of claim 17, wherein said applying a second power supply voltage comprises applying said first power supply voltage to each of said plurality pads.

* * * * *